United States Patent [19]

Tosaki et al.

[11] Patent Number: 4,547,625

[45] Date of Patent: Oct. 15, 1985

[54] GLASS MULTILAYER WIRING BOARD AND METHOD FOR ITS MANUFACTURE

[75] Inventors: Hiromi Tosaki, Yokohama; Hirayoshi Tanei, Tokyo; Akira Ikegami, Yokohama; Nobuyuki Sugishita, Yokosuka, all of Japan

[73] Assignee: Hitachi, Ltd., Tokyo, Japan

[21] Appl. No.: 511,482

[22] Filed: Jul. 7, 1983

[30] Foreign Application Priority Data

Jul. 8, 1982 [JP] Japan ................................ 57-117765

[51] Int. Cl.$^4$ .......................... C03C 3/08; H05K 1/03
[52] U.S. Cl. .................................... 174/68.5; 264/61; 361/414; 427/96; 428/137; 428/901; 501/16; 501/54; 501/61; 501/62
[58] Field of Search ................... 501/16, 61, 62, 15, 501/54; 427/96; 264/61; 174/68.5; 361/414; 428/137, 901

[56] References Cited

U.S. PATENT DOCUMENTS

| | | | |
|---|---|---|---|
| 3,808,042 | 4/1974 | Dietz | 501/62 |
| 3,998,667 | 12/1976 | Rapp | 501/4 |
| 4,221,047 | 9/1980 | Narken et al. | 29/840 |
| 4,301,324 | 11/1981 | Kumar et al. | 174/68.5 |
| 4,313,026 | 1/1982 | Yamada et al. | 174/68.5 |
| 4,378,481 | 3/1983 | Brennan et al. | 219/121 EH |
| 4,465,727 | 8/1984 | Fujita | 428/901 |
| 4,490,429 | 12/1984 | Tosaki et al. | 174/68.5 |

FOREIGN PATENT DOCUMENTS

| | | | |
|---|---|---|---|
| 57-6257 | 2/1982 | Japan . | |
| 58-60666 | 4/1983 | Japan | 501/54 |

OTHER PUBLICATIONS

Grubb, H. R., "Densely-Packaged Magnetic Film Memory," IBM Tech. Discl. Bull., vol. 14, No. 4, Sep. 1971, p. 1145.

*Primary Examiner*—Helen M. McCarthy
*Attorney, Agent, or Firm*—Antonelli, Terry & Wands

[57] ABSTRACT

A method for manufacturing the insulating layers of a glass multilayer wiring board from a mixture of (1) 30-90 wt. % of a borosilicate glass consisting of 55-75 wt. % of $SiO_2$, 13-25 wt. % of $B_2O_3$, 5-13 wt. % of $Al_2O_3$, each 1-5 wt. % of PbO, MgO, and BaO, and each 1-2 wt. % of $Na_2O$ and $K_2O$ and (2) 70-10 wt. % of a silica glass, is provided.

13 Claims, 2 Drawing Figures

GLASS MULTILAYER WIRING BOARD AND METHOD FOR ITS MANUFACTURE

BACKGROUND OF THE INVENTION

1. Field of the Invention

This invention relates to a glass multilayer wiring board for mounting large-scale integrated circuit chips and a method for manufacturing the same. More particularly, it relates to a multilayer wiring board with insulating layers of a glass having a low dielectric constant and a method for manufacturing the same.

2. Description of the Prior Art

The conventional ceramic multilayer wiring board for mounting large-scale integrated circuit (LSI) chips has been manufactured by printing wiring patterns with a tungsten conductor paste on green sheets (unsintered base sheets) made of alumina as a major constituent, filling the through-holes with said conductor paste, laminating the resulting green sheets, and sintering the laminated green sheets at 1500° C. under a non-oxidizing atmosphere. However, in an alumina-base multilayer wiring board thus prepared, since the relative dielectric constant of alumina is about 9 and the resistivity of tungsten wiring conductor is about 1 Ω/cm, the delay time of signal propagating through the multilayer wiring system is too large to cope with the operation speed-up.

For the above reason, there is a demand for a multilayer wiring board in which an insulating material having a low relative dielectric constant and a metallic wiring conductor of low resistance are combined. To answer the demand, there have been proposed (a) a method employing glass as the material for the insulating layer, on which is provided wiring conductors by using as the material a low-resistance metal such as gold, silver, or copper [Japanese Patent Kokai (Laid-open) No. 127,112/76] and (b) a method employing a crystallized glass containing α-cordierite or β-spodumene as a major constituent for the material of insulating layer, [Japanese Patent Kokai (Laid-open) Nos. 111,517/79 and 128,856/80]. However, the relative dielectric constant of these insulating glass layers is 5 or above and, hence, is still required to be lower in order to permit the operation to be carried out at a higher speed.

SUMMARY OF THE INVENTION

An object of this invention is to provide a glass multilayer wiring board employing as the insulating layer a glass having a relative dielectric constant below 5 and sintered under 900° C. and a method for the manufacture of such a wiring board.

The object above can be achieved by making the insulating layers of a multilayer wiring board from a mixture of borosilicate glass and silica glass.

Despite its favorable relative dielectric constant as low as about 4, the silica glass has not been used alone as the insulating layer, because of its much higher sintering temperature as compared with other types of glass such as borosilicate glass. The present inventors conducted performance tests on insulating layers made of a mixture of silica glass and various other types of glass, paying their attention to the desirable relative dielectric constant of silica glass. As a result, it has been found that a glass multilayer wiring board having a relative dielectric constant of below 5 is obtained by using insulating layers made of a mixture comprising 70 to 10 wt.% of silica glass and 30 to 90 wt.% of borosilicate glass having the following composition: 55-75 wt.% $SiO_2$, 13-25 wt.% $B_2O_3$, 5-13 wt.% $Al_2O_3$, each 1-5 wt.% PbO, MgO, and BaO, and each 1-2 wt.% $Na_2O$ and $K_2O$. The glass multilayer wiring board of this invention has an advantage of reduced propagation delay time of signals.

BRIEF DESCRIPTION OF THE DRAWING

In FIG. 1, 1 is green sheet, 2 through-hole, 3 register hole for the alignment of relative position of each insulating layer, 4 conductor filled in a through-hole, and 5 wiring conductor.

In FIG. 2, 5 is wiring conductor, 6 insulating base sheet, 7 terminal pad area for mounting LSI, 8 pad portion for connecting with input or output pin.

DETAILED DESCRIPTION OF THE PREFERRED EMBODIMENTS

Figure 1:
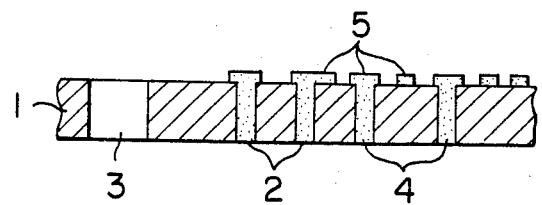
FIG. 1 is a sectional view of the green sheet in one of the embodiments of the glass multilayer wiring board according to this invention.

The composition of each borosilicate glass used in this invention is as shown in Table 1 (Sample Nos. 1-6).

TABLE 1

| Sample No. | 1 | 2 | 3 | 4 | 5 | 6 |
|---|---|---|---|---|---|---|
| Constituent (wt. %) | | | | | | |
| $SiO_2$ | 55 | 58 | 61 | 64 | 70 | 75 |
| $B_2O_3$ | 25 | 23 | 22 | 16 | 13 | 13 |
| $Al_2O_3$ | 5 | 5 | 5 | 13 | 10 | 5 |
| PbO | 1 | 5 | 3 | 2 | 3 | 1 |
| MgO | 5 | 2 | 3 | 2 | 1 | 3 |
| BaO | 5 | 5 | 4 | 1 | 1 | 1 |
| $Na_2O$ | 2 | 1 | 1 | 1 | 1 | 1 |
| $K_2O$ | 2 | 1 | 1 | 1 | 1 | 1 |
| Softening point (°C.) | 685 | 712 | 743 | 767 | 781 | 805 |
| Relative dielectric constant | 5.1 | 5.0 | 4.5 | 4.4 | 4.3 | 4.3 |

A glass mixture comprising 30 wt.% of borosilicate glass and 70 wt.% of silica glass showed a relative dielectric constant of 4.05 at minimum, while a glass mixture comprising 90 wt.% of borosilicate glass and 10 wt.% of silica glass showed a relative dielectric constant of 4.95 at maximum as shown in detail in Table 2.

TABLE 2

| Sample No. (Table 1) of borosilicate glass | Relative dielectric constant of a mixture of 30 wt. % of borosilicate glass and 70 wt. % of silica glass | Relative dielectric constant of a mixture of 90 wt. % of borosilicate glass and 10 wt. % of silica glass |
|---|---|---|
| 1 | 4.30 (800° C.)* | 4.95 (800° C.)* |
| 2 | 4.25 | 4.85 |
| 3 | 4.15 (850° C.)* | 4.45 (850° C.)* |
| 4 | 4.10 | 4.35 |
| 5 | 4.05 | 4.25 |
| 6 | 4.05 (900° C.)* | 4.20 (900° C.)* |

*sintering temperature

In the insulating layer made of a mixture of borosilicate glass and silica glass having the composition shown in Table 1, there occurs no such deformation of the wiring pattern due to the flow of excessively molten glass in heat treatment, while such deformation of the wiring pattern occurs with amorphous borosilicate glass. The glass mixture according to this invention shows a relative dielectric constant below 5, a value smaller than that of borosilicate glass itself.

The conductor material used for the wiring provided on the insulating layer or for filling the through-hole consists of a low-resistance metal alone such as gold, silver, copper, or the like or a mixture of these metals with the same borosilicate glass as used in the glass mixture for making the insulating layer, the amount of said borosilicate glass being 10 wt.% or less based on the total of low-resistance metal and glass. The addition of borosilicate glass to the metal for use as the material for conductor wiring is generally unnecessary, because the amorphous borosilicate glass contained in a green sheet, which forms the insulating layer, penetrates the wiring conductor upon sintering, thus acting as a binder to improve the adhesion between the wiring conductor and the insulating layer. However, the preliminary addition of 10 wt.% or less of the borosilicate glass to the metal for use as the material of wiring conductor further improves the adhesion between the wiring conductor and the insulating layer. The upper limit of the amount of borosilicate glass added to the metal is settled at 10 wt.%, because if the amount of glass exceeds 10 wt.%, the resistance of wiring conductor becomes too large upon sintering to take advantage of the low-resistance metal such as gold, silver, or copper used as the material for wiring conductor.

The invention is further illustrated below with reference to Examples.

EXAMPLE 1

Figure 2:
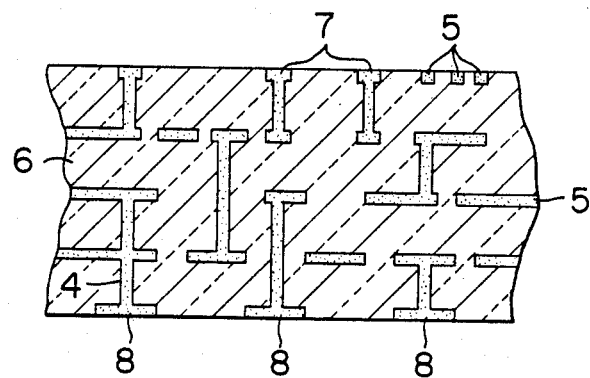
FIG. 2 is a sectional view of a glass wiring board obtained by sintering the laminated assembly of green sheets of FIG. 1 in one of the embodiments of this invention.

The green sheet shown in FIG. 1 is provided with through-hole 2, register hole 3 for the alignment of positions, conductor 4 filled in the through-hole, and wiring conductor 5, said conductors 4 and 5 being disposed by screen printing. As shown in FIG. 2, a glass multilayer wiring board, which is obtained after sintering, consists of an insulating base board 6; wiring conductor 5 and conductor 4 packed in the through-hole, both conductors being arranged in multilayer within said insulating base board 6; wiring conductor 5 arranged on upper and lower surfaces of insulating base board 6; pad portion 7 for mounting LSI, and pad portion 8 for connecting with input and output pins.

The above green sheet and multilayer wiring board were made by way of the following sequence of steps:

(a) A mixture was prepared in a ball mill from 100 g of a borosilicate glass powder (sample No. 3 in Table 1), 2.5 μm in average particle size, and 100 g of a silica glass powder, 2.0 μm in average particle size. To the mixture were added 20 g of a polyvinyl butyral resin as binder, 3 ml of butylphthalyl butyl glycolate as plasticizer, and 100 ml of a volatile solvent. The resulting mixture was milled in a ball mill for 24 hours and defoamed under reduced pressure to prepare a glass slip.

(b) The glass slip prepared as described above was spread over a polyester film by means of a doctor blade coater so as to form a continuous dried sheet of 0.15 mm in thickness. The dried sheet was stripped off the polyester film and cut to sheets, 10×10 cm in size, to prepare green sheet 1 of glass. The through-hole 2 necessary for the circuitry and the register hole 3 for the alignment of green sheet positions in printing and laminating were drilled through green sheet 1.

(c) To 100 g of powdered gold, was added 20 ml or 30 ml of an α-terpineol solution containing dissolved ethylcellulose. Each mixture was milled on a roll mill to prepare two types of conductor paste having viscosities of 500,000 and 200,000 cps, respectively.

(d) The through-hole 2 of green sheet 1 was filled with the paste having a higher viscosity of 500,000 cps to form a through-hole conductor 4. Another paste having a lower viscosity of 200,000 cps was used to print on the green sheet a necessary pattern including wiring conductor 5, terminal pad area 7 for mounting LSI and pad area 8 for connection with an input or output pin.

(e) The green sheets each carrying a predetermined pattern were placed one over another, the position of each sheet being adjusted by referring to the register hole 3. The assembly of green sheets was pressed for 10 minutes at an applied pressure of 40 kg/cm$^2$ and a temperature of 120° C. to effect lamination. The margin of the resulting laminate including the register hole 3 was cut off, leaving behind a laminated circuit board which is required.

(f) The laminate was heated up to 400° C. at a rate of 200° C./hour. It was kept at 400° C. for one hour to remove organic matters such as the binder, then the temperature was elevated at a rate of 200° C./hour up to 850° C., and kept at 850° C. for one hour to complete the sintering, whereby a plural number of green sheets 1 were integrated into single insulating board 6, forming a glass multilayer wiring board.

In the above procedure, a green sheet shown in FIG. 1 was formed through steps (a)–(d) and a multilayer wiring board shown in FIG. 2 was formed through the entire steps (a)–(f). The resistivity of the wiring conductor 5 in the multilayer wiring board was 0.4 Ω/cm for a strip of 75 μm in width, and the relative dielectric constant of the insulating board 6 was 4.3, both values being very small.

EXAMPLE 2

A green sheet 1 of 0.15 mm in thickness was formed in a manner similar to that in Example 1 by using 60 g of a borosilicate glass powder (sample No. 1 of Table 1) having an average particle size of 2.3 μm, a relative dielectric constant of 5.1, and a softening point of 685° C. and comprising 55 wt.% of $SiO_2$, 25 wt.% of $B_2O_3$, 5 wt.% of $Al_2O_3$, 5 wt.% of BaO, 5 wt.% of MgO, 1 wt.% of PbO, 2 wt.% of $Na_2O$, and 2 wt.% of $K_2O$, and 140 g of a silica glass powder having an average particle size of 2.0 μm.

A conductor paste was prepared from 90 g of a silver powder, 10 g of borosilicate glass of the same composition as that used in the above green sheet, an organic binder and a solvent. By using the conductor paste and in the same manner as in Example 1, a predetermined circuit pattern 5 was formed on the green sheet and a through-hole conductor 4 was formed in the through-hole 2. The resulting green sheets were placed one over another, heated at 400° C. for one hour to remove the organic matters, and sintered by heating at 800° C. for 30 minutes to prepare a glass multilayer wiring board. The resistivity of the wiring conductor 5 in the glass multilayer wiring board thus prepared was 0.5 Ω/cm for a conductor strip of 75 μm in width, and the relative dielectric constant of the insulating board 6 was 4.3.

EXAMPLE 3

A green sheet 1 of 0.15 mm in thickness was formed in a manner similar to that in Example 1 by using 180 g of a borosilicate glass powder (sample No. 6 of Table 1) having an average particle size of 2.7 μm, a relative dielectric constant of 4.3, and a softening point of 805° C. and comprising 75 wt.% of $SiO_2$, 13 wt.% of $B_2O_3$, 5 wt.% of $Al_2O_3$, 1 wt.% of PbO, 3 wt.% of MgO, 1 wt.% of BaO, 1 wt.% of $Na_2O$, and 1 wt.% of $K_2O$, and 20 g of a silica glass powder having an average particle size of 2.0 μm.

A conductor paste was prepared from a copper powder in a manner similar to that in Example 1. By using the paste, a wiring pattern 5 and a through-hole conductor 4 were formed in a manner similar to that in Example 1. The resulting green sheets were placed one over another and the assembly was heated at 600° C. for one hour under an atmosphere of a mixture of hydrogen, steam, and nitrogen to remove organic matters and then sintered at 900° C. for one hour under a nitrogen atmosphere to form a glass multilayer wiring board. The resistivity of the wiring conductor 5 in the glass multilayer wiring board thus formed was 0.4 Ω/cm for a conductor strip of 75 μm in width, and the relative dielectric constant of the insulating board 6 was 4.2.

What is claimed is:

1. A sintered glass multilayer wiring board consisting essentially of 70–10 wt.% of silica glass and 30–90 wt.% of a borosilicate glass consisting essentially of 55–75 wt.% of $SiO_2$, 13–25 wt.% of $B_2O_3$, 5–13 wt.% of $Al_2O_3$, each 1–5 wt.% of PbO, MgO and BaO, and each 1–2 wt.% of $Na_2O$ and $K_2O$, said wiring board having a relative dielectric constant below 5 and being sintered at a temperature of at most 900° C.

2. A sintered glass multilayer wiring board according to claim 1, said board comprising a plurality of sheets laminated to each other, the sheets consisting essentially of 70–10 wt% of said silica glass and 30–90 wt% of said borosilicate glass.

3. A sintered glass multilayer wiring board according to claim 2, wherein said sheets have formed thereon, prior to laminating the plurality of sheets, a wiring conductor, said wiring conductor being formed of a low-resistance conducting material.

4. A sintered glass multilayer wiring board according to claim 1, wherein said board has formed thereon, prior to sintering thereof, a conductor comprising a low-resistance conducting material.

5. An improved method for making a glass multilayer wiring board in which a plural number of green sheets carrying each a wiring conductor are arranged to form a laminated assembly and the assembly is sintered, wherein the improvement comprises a sequence of the steps of making a green sheet from a mixture consisting essentially of silica glass powder and a borosilicate glass powder consisting essentially of 55–75 wt.% of $SiO_2$, 13–25 wt.% of $B_2O_3$, 5–13 wt.% of $Al_2O_3$, each 1–5 wt.% of PbO, MgO and BaO, and each 1–2 wt.% of $Na_2O$ and $K_2O$, the silica glass content of said mixture being 10–70 wt.%; forming on said green sheet a conductor comprising a low-resistance conducting material; placing a number of green sheets carrying the conductor one over another to form a multilayer assembly; and sintering the multilayer assembly, said sintering the multilayer assembly performed at a temperature of at most 900° C., whereby a wiring board having a relative dielectric constant below 5 is formed while deformation of the conductor due to flow of glass during heat treatment is prevented.

6. A method for making a glass multilayer wiring board according to claim 5, wherein the low-resistance conducting material comprises gold, silver, or copper and 0–10 wt.% of the said borosilicate glass powder.

7. A method for making a glass multilayer wiring board according to claim 5, wherein said low-resistance conducting material is copper, and wherein the sintering is carried out in a nitrogen atmosphere.

8. A method for forming a sintered glass multilayer wiring board comprising the steps of preparing a mixture consisting essentially of borosilicate glass powder and silica glass powder, said mixture being 70 to 10 wt% of silica glass and 30 to 90 wt% of borosilicate glass consisting essentially of 55–75 wt% of $SiO_2$, 13–25 wt% of $B_2O_3$, 5–13 wt% of $Al_2O_3$, each 1–5 wt% of PbO, MgO and BaO, and each 1–2 wt% of $Na_2O$ and $K_2O$; forming the mixture into a green sheet; and sintering said green sheet at a temperature of at most 900° C. to form said board, whereby a wiring board having a relative dielectric constant below 5 is formed.

9. A method for forming a sintered glass multilayer wiring board according to claim 8, wherein a plurality of green sheets of said mixture are formed, and are laminated on one another to form multiple layers, and then the sintering is performed to sinter the laminate of green sheets.

10. Product formed by the process of claim 8.

11. Product formed by the process of claim 9.

12. A method for making a glass multilayer wiring board according to claim 8, wherein said green sheet has formed thereon, prior to sintering thereof, a conductor of copper in the form of a wiring pattern, and wherein the sintering is carried out in a nitrogen atmosphere.

13. A method for forming a sintered glass multilayer wiring board according to claim 8, wherein, prior to said sintering, a wiring pattern of a low-resistance conducting material is formed on said green sheet.

* * * * *